United States Patent [19]
Nagami

[11] Patent Number: 5,382,897
[45] Date of Patent: Jan. 17, 1995

[54] CROSS-COIL TYPE MEASURING INSTRUMENT WITH CORRECTION MEANS FOR VARYING A SUPPLY VOLTAGE

[75] Inventor: Masafumi Nagami, Saitama, Japan
[73] Assignee: Kansei Corporation, Saitama, Japan
[21] Appl. No.: 965,925
[22] Filed: Oct. 23, 1992

[30] Foreign Application Priority Data
Oct. 24, 1991 [JP] Japan ................. 3-094944[U]
Nov. 28, 1991 [JP] Japan ................. 3-105345[U]

[51] Int. Cl.⁶ ................. G01R 11/36; G01P 3/48
[52] U.S. Cl. ................. 324/143; 324/76.39
[58] Field of Search ........... 324/143, 140 R, 140 D, 324/144, 146, 151 A, 151 R, 76.39, 76.47

[56] References Cited
FOREIGN PATENT DOCUMENTS
3329761 2/1985 Germany ................. 324/143
63-84573 6/1988 Japan.
3-74363 7/1991 Japan.

Primary Examiner—Walter E. Snow
Attorney, Agent, or Firm—Longacre & White

[57] ABSTRACT

A cross-coil type measuring instrument which is employed as an engine tachometer for instance. A cross-coil type measuring instrument includes a cross-coil type measuring unit having a pair of coils arranged crossed forming a predetermined angle with each other, and a movable magnet magnetized bi-polar which is set rotatable by the magnetic action of said pair of coils, a driving circuit for producing polarized drive signals which are different from each other in phase and change in response to variation in values to be measured, and a constant voltage source for supplying a first constant voltage to the driving unit, the first constant voltage being switched to a second constant voltage periodically in response to a switching signal. Due to the switching of the constant voltage, the amount of power supplied to the cross coils can be made smaller resulting in reducing the amount of heat generated therein as much.

14 Claims, 8 Drawing Sheets

CROSS-COIL TYPE MEASURING INSTRUMENT WITH CORRECTION MEANS FOR VARYING A SUPPLY VOLTAGE

BACKGROUND OF THE INVENTION

1. Field of the Invention

The present invention relates to a cross-coil type measuring instrument which is employed as an engine tachometer for instance.

2. Description of the Related Art

A conventional cross-coil type measuring instrument, as shown in FIG. 9, comprises a frequency measuring circuit 11 for measuring either frequency or period of a pulse signal produced by a sensor such as a vehicle running speed sensor, an arithmetic circuit 13 for dividing an output of the frequency measuring circuit 11 into a sine wave component and a cosine wave component, a since wave function generator 21 and a cosine wave function generator 22, a first pulse wave modulation circuit 14 for subjecting an approximate sine wave signal from the sine wave function generator 21, a second pulse wave modulation circuit 15 for subjecting an approximate cosine wave signal from the cosine wave function generator 22, and output circuits 31 and 32 for driving coils 31 and 32 of a cross-coil type measuring unit 4, respectively, in response to the outputs of the first and second PWM circuits 14 and 15. Reference numeral 7 designates a constant voltage source connected to a battery 6 to produce a constant voltage output of 8 V. Published Unexamined Japanese Utility Model Application No. Hei-3-74363 discloses an example of the above described conventional instrument.

The conventional cross-coil type measuring instrument thus organized suffers from the following difficulties. That is, the instrument has a mechanical hysteresis attributing to its bearings or the like. In order to cancel the hysteresis, a constant voltage of 8 V which is higher than an ordinary power source voltage is applied to the drive circuits 24 and 25 so that predetermined currents are caused to flow in the cross coils 31 and 32 to drive a cross-coil type measuring unit 4. As a result, the measuring unit 4 is allowed to indicae a correct measurement value. Hence, not only the constant voltage circuit 7 but also the cross coils 31 and 32 generate a large amount of heat. Accordingly, it is necessary for the instrument to have heat radiating means. In other words, the instrument must have a space for installation of a heat radiating board.

Furthermore, with the conventional cross-coil type measuring instrument, the coils 31 and 32 may be different in length, and accordingly in resistance, which leads to an error in indication. In addition, since the constant voltage source 7 and the coils 31 and 32 produces a large amount of heat as was described above, the coils are changed greatly in resistance, which also leads to an error in indication.

Moreover, with the conventional cross-coil type measuring instrument, the drive coils 31 and 32 are arranged crossed, forming 90° degree with each other. Therefore, when a current flows in one of the drive coils 31 and 32, which attributes to a square wave coil drive voltage concerning the PWM (pulse width modulation) signal, then a mutual interference occurs between the drive coils 31 and 32, for instance, by electromagnetic induction, so that an induction current flows in the other drive coil (hereinafter referred to as "an interference current", when applicable). The interference current is superposed on the coil drive signal, thus resulting in an error in indication. The value of the interference current depends on the value of the coil drive current and the electromagnetic coupling condition of the drive coils 31 and 32. Hence, in the case of the drive coils 31 and 32 in which the coil drive current and the magnetic coupling condition change with the ambient temperature, the value of the induction current changes with the ambient temperature. Therefore, even if the indication is adjusted at room temperature, the indication will be deviated depending on the ambient temperature. In this case, it is rather difficult to process the signals suitably by using circuit elements.

SUMMARY OF THE INVENTION

Accordingly, an object of this invention is to eliminate the above-described difficulties accompanying a conventional cross-coil type measuring instrument.

More specifically, an object of the invention is to provide a cross-coil type measuring instrument which is so improved that the amount of heat generated therein is greatly reduced, and the mechanical hysteresis is reduced efficiently.

The above and other objects of the invention have been achieved by the provision of a cross-coil type measuring instrument comprising a cross-coil type measuring means including a pair of coils arranged crossed forming a predetermined angle with each other, and a movable magnet magnetized bi-polar which is set rotatable by the magnetic action of the pair of coils, a driving means for producing polarized drive signals which are different from each other in phase and change in response to variation in values to be measured, and a constant voltage source for supplying a first constant voltage to said driving means, the first constant voltage being switched to a second constant voltage periodically in response to a switching signal.

As described above, according to the present invention, the voltage supplied from the constant voltage circuit to the drive circuit is switched high and low periodically, so that the amount of power supplied to the cross coils is reduced, and the amount of heat generated therein is thus decreased as much. Furthermore, in the instrument, the voltages applied to the cross coils are pulsated with a predetermined voltage. Therefore, the mechanical hysteresis is more reduced than in the case where a high DC voltage rippled is applied to the coils.

BRIEF DESCRIPTION OF THE DRAWINGS

The accompanying drawings, which are incorporated in and constitute a part of the specification, illustrated presently preferred embodiments of the invention and, together with the general description given above and the detailed description of the preferred embodiments given below, serve to explain the principles of the invention. In the accompanying drawings.

DESCRIPTION OF THE PREFERRED EMBODIMENTS

Figure 3:
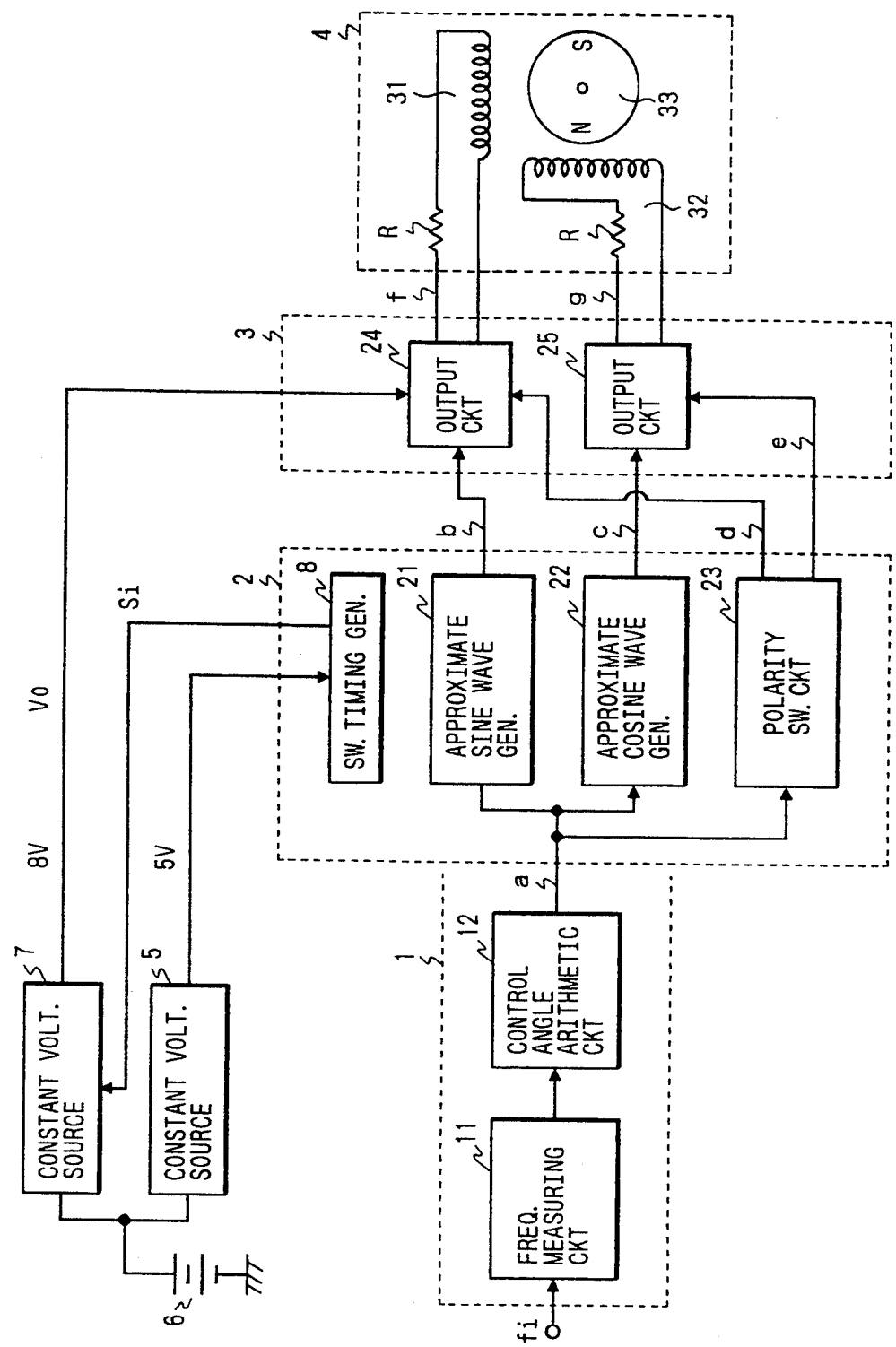
FIG. 3 is a circuit diagram, partly as a block diagram, showing the arrangement of an example of a cross-coil type measuring instrument, which constitutes a first embodiment of the invention.

A first embodiment of a cross-coil type measuring instrument according to this invention will be described with reference to FIGS. 3 to 6. The first embodiment of the cross-coil type measuring instrument, as shown in FIG. 3, comprises a frequency-control angle arithmetic circuit 1 (hereinafter referred to as "an input signal arithmetic circuit 1", when applicable), a drive signal arithmetic circuit 2, a drive circuit 3 and a cross-coil type measuring unit 4.

Figure 2:
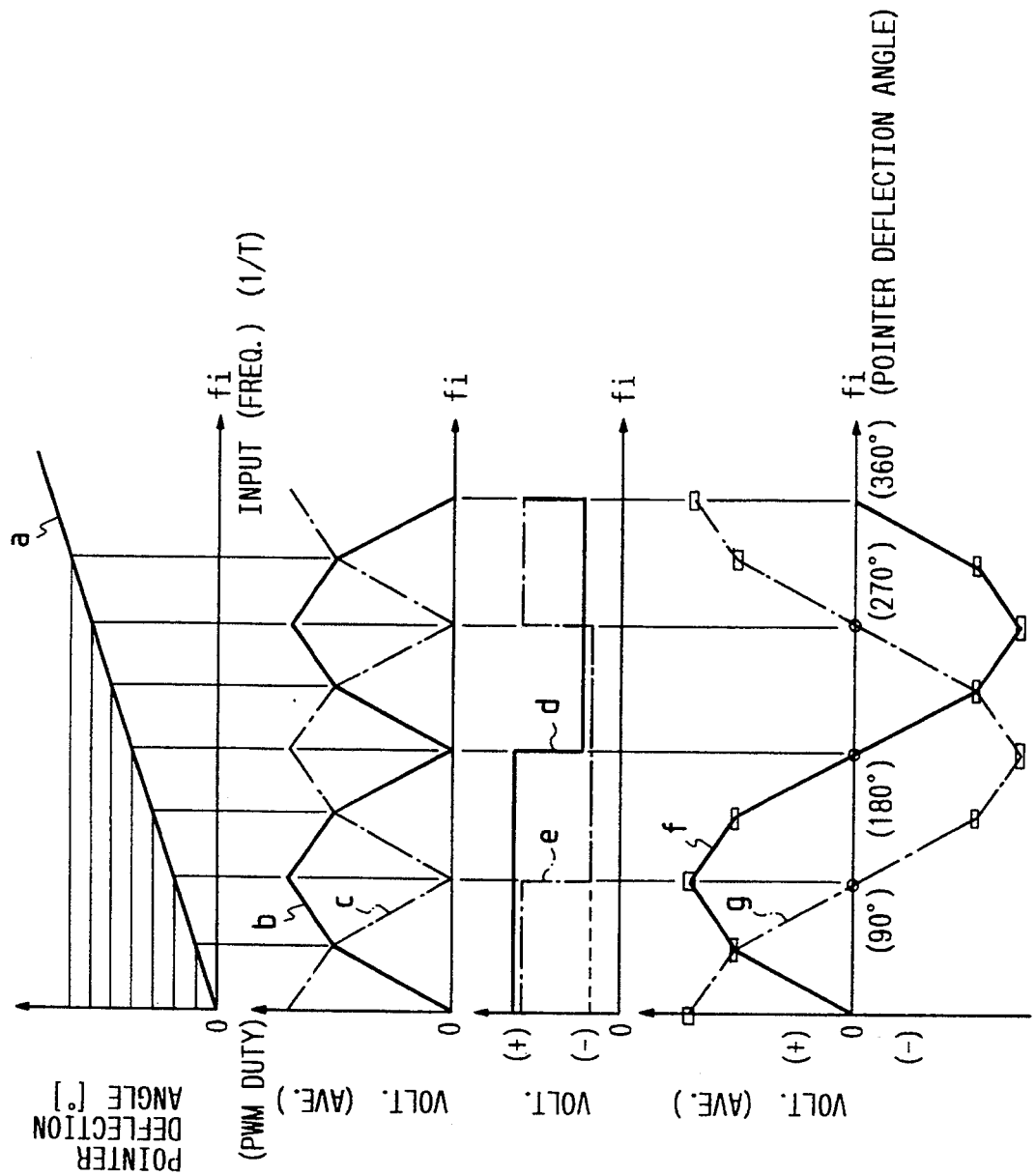
FIGS. 2(a) to 2(d) are waveform diagrams showing the waveforms of signals at various circuit points in FIG. 1.

The input signal arithmetic circuit 1 is composed of a frequency measuring circuit 11 and a control angle arithmetic circuit 12. The frequency measuring circuit 11 operates to measure the period (T) of a frequency signal fi whose frequency changes with data to be measured such as an engine speed, so as to obtain an input frequency fi from the period (T). The control angle arithmetic circuit 12 operates to covert the period (T=1/fi) measured by the frequency measuring circuit 11 into a movable magnet rotation control angle signal a (hereinafter referred to as "a pointer deflection angle signal a", when applicable), which is applied to the drive signal arithmetic circuit 2. FIG. 2(a) is a waveform diagram showing an example of the pointer deflection angle signal a.

The drive signal arithmetic circuit 2 comprises an approximate sine wave generating circuit 21, an approximate cosine wave generating circuit 22 and a polarity switching circuit 23. The above-described circuits 11, 12, 21, 22 and 23 are each made up of a micro-computer for instance.

The approximate sine wave generating circuit 21 and the approximate cosine wave generating circuit 22 receive the pointer deflection angle signal a from the input signal arithmetic circuit 1. The circuits 21 and 22 perform signal processing operations such as angle comparison and phase shift according to the pointer deflection angle signal a, to produce PWM signals b and c, respectively, which have difference of 90° in phase with respect to each other and vary with the angle value of the signal a, showing pentagonal wave characteristics. Shown in FIGS. 2(b) are examples of the waveforms of PWM signals b and c. The polarity switching circuit 23, in response to the above-described signal a, outputs polarity switching signals d and e in order to polarize the output signals b and c of the approximate sine wave generating circuit 21 and the approximate cosine wave generating circuit 22. FIG. 2(c) is a waveform diagram showing examples of the polarity switching signals d and e.

The aforementioned drive circuit 3 includes two output circuits 24 and 25 which are two-way switching circuits made up of transistors. The output circuits 24 and 25 subject the output signals b and c of the approximate sine wave generating circuit 21 and the approximate cosine wave generating circuit 22 to current amplification, and further polarize the output signals b and c according to the polarity switching signals d and e, to output two kinds of drive signals f and g as shown in FIG. 2(d), respectively.

The cross-coil type measuring unit 4 comprises a pair of coils 31 and 32 which receive the drive signals f and g from the drive circuit 2, respectively, and are arranged crossed forming 90° with each other, a movable magnet 33 magnetized bi-polar which is set rotatable by the magnetic action of the coils 31 and 32.

Constant voltage sources 5 and 6 are provided to make the output voltage of a power source 6 constant thereby supplying a constant voltage of 5 V to the signal processing circuit 2 and a constant voltage of 8 V to the drive circuit 3, respectively.

In addition these circuit elements as described above, as shown in FIG. 3, a switching timing generating circuit 8 is provided to switch the output voltage of the constant voltage source 7 periodically high and low. The switching timing is formed by the drive signal arithmetic circuit 2, and therefore the switching timing generating circuit 8 is provided in the drive signal arithmetic circuit 2.

Figure 4:
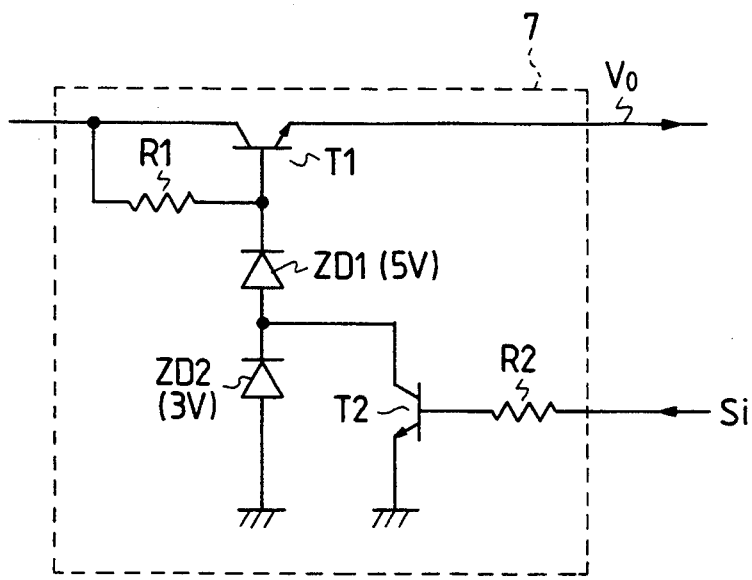
FIG. 4 is a circuit diagram showing a concrete example of a constant voltage source shown in FIG. 3.

The constant voltage source 7, as shown in FIG. 4 in detail, includes a transistor T1, a resistor R1 connected between the collector and the base of the transistor T1, a series circuit of a Zener diode ZD1 having Zener voltage of 5 V and a Zener diode ZD2 having Zener voltage of 3 V, which is connected to the base of the transistor T1, a transistor T2 connected in parallel to the Zener diode ZD2 and a resistor R2 connected to the base of the transistor T2 to which a switching timing signal Si is applied through the resistor R2.

The operation of the cross-coil type measuring instrument thus organized will be described with reference to a timing chart of FIG. 5 and a flow chart of FIG. 6. The operations of the input signal arithmetic circuit 1, the approximate sine wave generating circuit 21, the approximate cosine wave generating circuit 22 and the polarity switching circuit 23 in the drive signal arithmetic circuit 2.

In the first embodiment, the drive signal arithmetic circuit 2 and the input signal arithmetic circuit 1, being micro-computers, perform the period measurement of the input signal fi, data operations such as averaging operation, control angle conversion, operations on PWM values of sine and cosine waves, and controls the period T and pause width t of the switching timing signal Si, thereby to perform the PWM output control for the drive circuit 3 (Steps ST-1 through ST-6).

Figure 5:
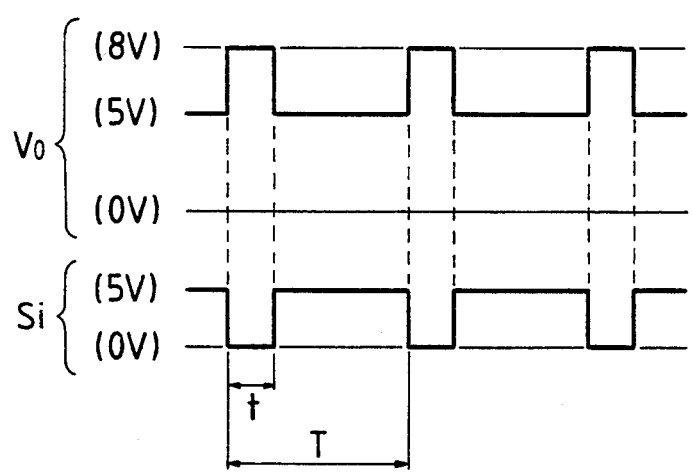
FIG. 5 is a timing chart for a description of signals at various circuit points in FIG. 3.
Figure 6:
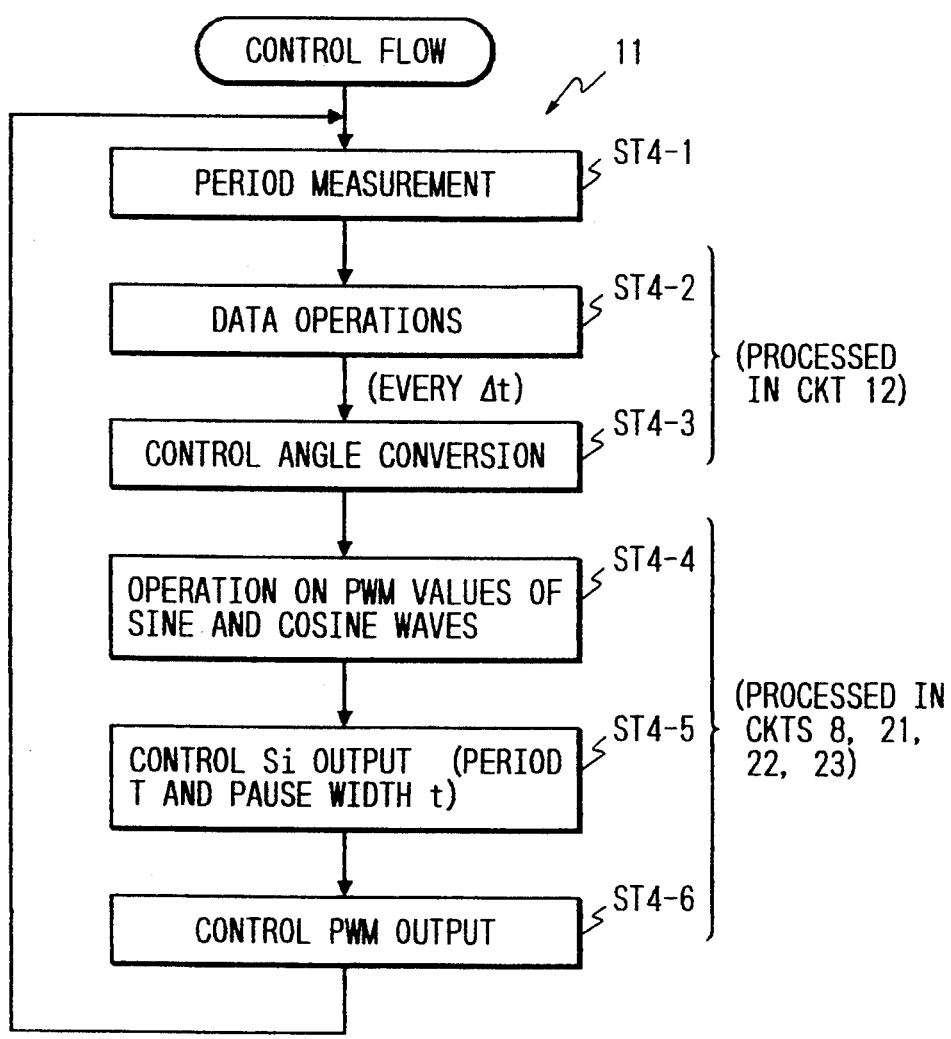
FIG. 6 is a flow chart for a description of the operation of the cross-coil type measuring instrument shown in FIG. 3.

When the switching timing signal Si, the period T and pause width t of which have been controlled as shown in FIG. 5, is applied to the base of the transistor T2 of the constant voltage source 7, the transistor T2 is rendered conductive (on) and non-conductive (off) in response to the levels of the switching timing signal Si. As the transistor T2 is rendered conductive and non-conductive in this manner, the output voltage Vo of the constant voltage source 7 changes to 5 V and 8 V periodically as shown in FIG. 5.

The pulse signal of high voltage 8 V is large enough in pulse width, being several milli-seconds (ms). Therefore, when the period is set to several tens milli-seconds (ms), then the duty cycle of the pulse signal of high voltage 8 V is several percent (%). It is experimentally confirmed that, during PWM drive of 20 KHz, if the pulse width of the pulse signal of high voltage 8 V is set to 1 milli-second and the period is set to 32 milli-seconds, there occurs no problems such as a pointer vibration, a pointer skip and the like.

In the cross-coil type measuring instrument, it is impossible to make the offset voltage of an operational amplifier or the like equal to zero completely, which is provided so that the approximate sine wave generating circuit 21 and the approximate cosine wave generating circuit 22 subject a DC voltage signal a to a signal process such as angle comparison or phase shift to produce the PWM signals b and c which change showing the characteristics of a pentagonal wave. Hence, a pointer skip phenomenon A where the pointer of the cross-coil type measuring instrument moves in a rate of change which is extremely larger than a predetermined normal rate, occurs at the point marked with "O" in FIG. 2(d). On the other hand, there may occur a pointer stop phenomenon B where the movement of the pointer of the cross-coil type measuring instrument does not follow the variation in the input, at the point marked with "□".

In this embodiment, the output signals of the drive circuit 3 are changed periodically as was described above. Hence, even if the signals change to the extent that the pointer skip phenomenon or the pointer stop phenomenon may occur because of the arrangement of the waveform generating circuits, the variation of the signals is absorbed in a ripple signal, so that apparently the pointer skip phenomenon or pointer stop phenomenon can be eliminated. Further, the voltages applied to the cross coils are pulsated, and therefore the drive torque is also pulsated low at low voltage and high at high voltage. As a result, the drive shaft is vibrated with a ripple frequency thereby resulting in lessening the hysteresis.

As set forth above, in the cross-coil type measuring instrument, since the constant voltage circuit supplies the voltage varying periodically to the drive circuit adapted to apply the drive signals to the pair of cross coils, the amount of power supplied to the cross coils can be made smaller than in the conventional cross-coil type measuring instrument resulting in reducing the amount of heat generated therein as much.

Further, the output signals of the output circuits also change periodically, and thus the pointer skip phenomenon and the pointer stop phenomenon can be also substantially eliminated which are due to the fluctuation in manufacture of the drive circuit, and to the temperature characteristics and the voltage characteristics of the latter, and the mechanical hysteresis of the cross-coil type measuring unit can be decreased.

While current limiting resistors R are provided between the output circuits 24 and 25 and the coils 31 and 32, respectively, these resistors R may be removed because the above described difficulties accompanying the conventional device may be eliminated substantially by the switching of the power source voltage.

In addition, two separate constant voltage sources 5 and 7 are employed in the first embodiment, but a single constant voltage source for producing a constant voltage of 8 V may be acceptable. In this case, the higher voltage of 8 V is reduced in voltage level to 5 V by a voltage level-shifter provided in the drive circuit 3.

The function similar to that of the first embodiment can be attained by the following modifications of the embodiment.

Figure 1:
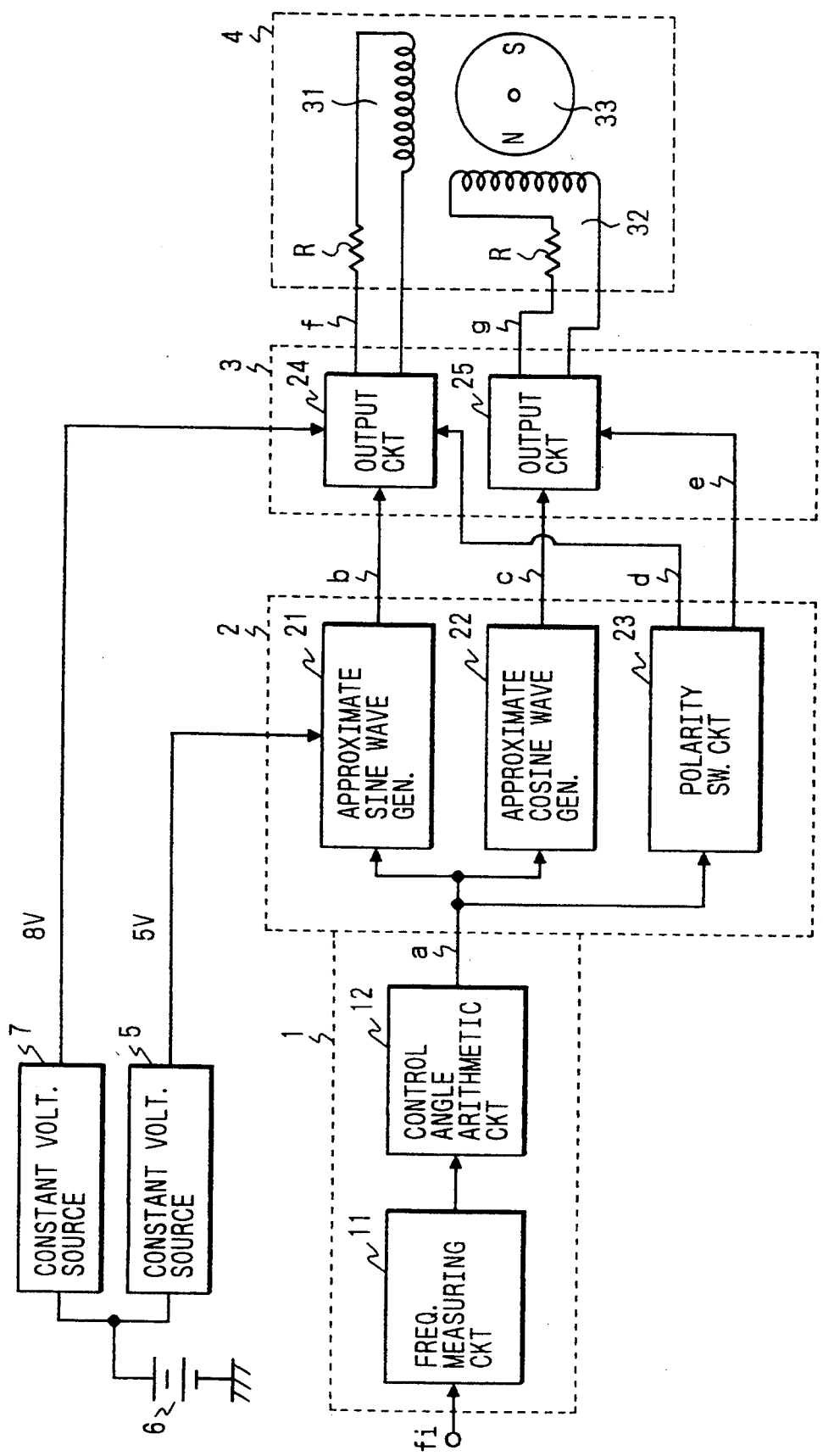
FIG. 1 is a circuit diagram, partly as a block-diagram, showing the arrangement of an example of a cross-coil type measuring instrument, which constitutes a second embodiment of the invention.

A second embodiment of the cross-coil type measuring instrument will be described with reference to FIG. 1. As shown in FIG. 1, the coils 31 and 32 are connected to the output circuits 24 and 25 through current limiting resistor R, respectively. In this case, it should be noted that the amount of power supplied to the cross coils 31 and 32 and the current limiting resistors R is made smaller to thereby reduce the amount of heated generated as much.

Figure 7:
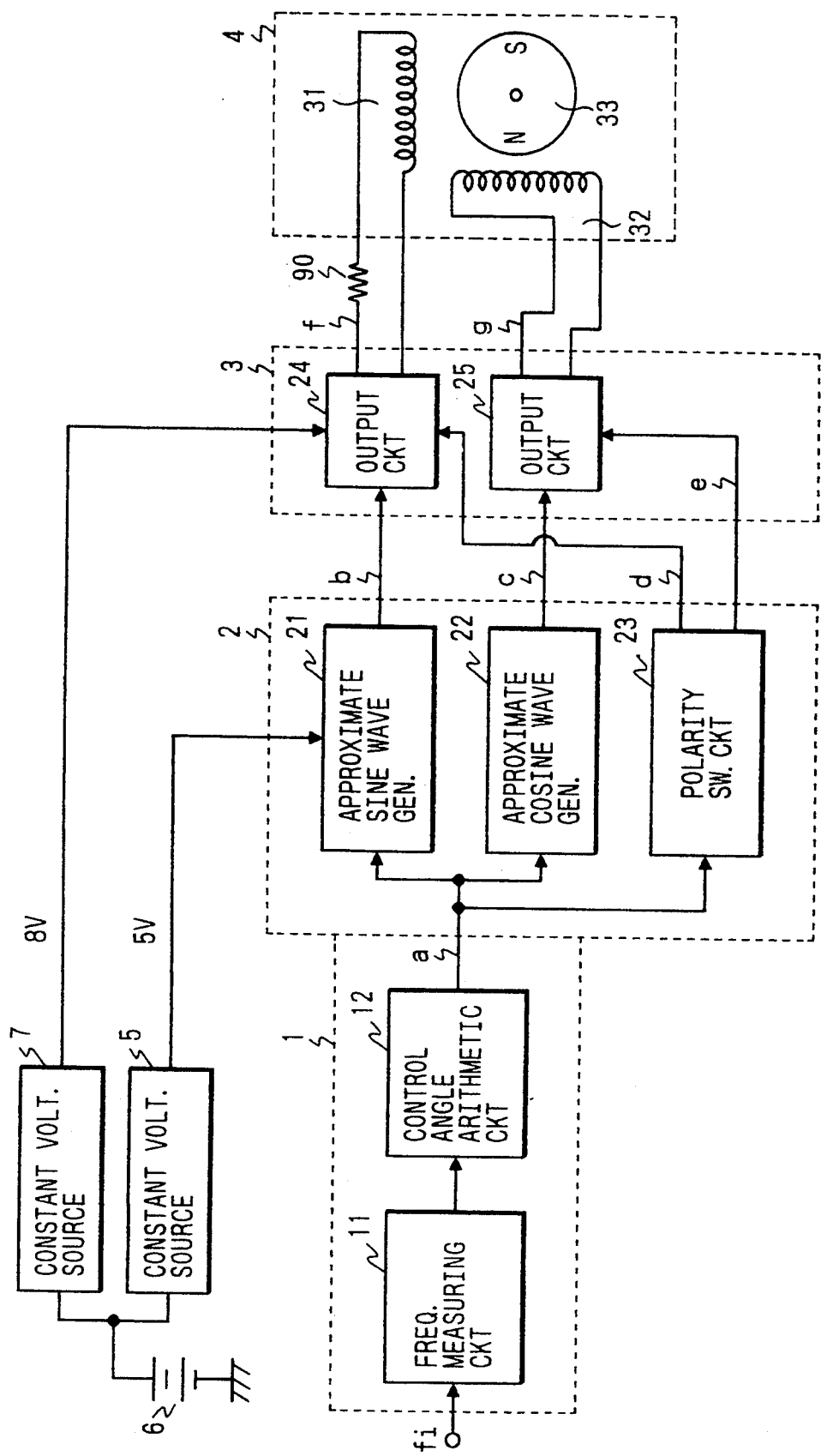
FIG. 7 is a circuit diagram, partly as a block diagram, showing the arrangement of an example of a cross-coil type measuring instrument, which constitutes a third embodiment of the invention.

Further, the current limiting resistors R may be replaced by a positive characteristic heat-sensitive resistance element such as a positive characteristic thermistor, which is connected between the output circuit 24 and the coil 31 or between the output circuit 25 and the coil 32 to make the resistances of the coils 31 and 32, as viewed from the output terminals of the output circuits 24 and 25, equal to each other. That is, when the coils 31 and 32 are increased in temperature, the heat-sensitive resistance element acts to make the resistances of the coils 31 and 32 equal to each other. This modification is shown as a third embodiment of the invention in FIG. 7 where the above described positive characteristic heat resistance element is designated by reference numeral 90.

It is preferable to use a heat resistance element having the same thermal characteristic as that of resistance component of the cross-coils. An example of the heat-sensitive resistance element is ERSL 39J12 manufactured by Matsushita Electrics Corp.

As was described above, in the third embodiment, the positive characteristic heat-sensitive resistance element which is equal in temperature characteristic to the coils is inserted between the drive circuit and one of the coils. Hence, the currents flowing in the coils are scarcely affected by temperature. That is, the cross-coil type measuring instrument is improved in temperature characteristic.

Figure 8:
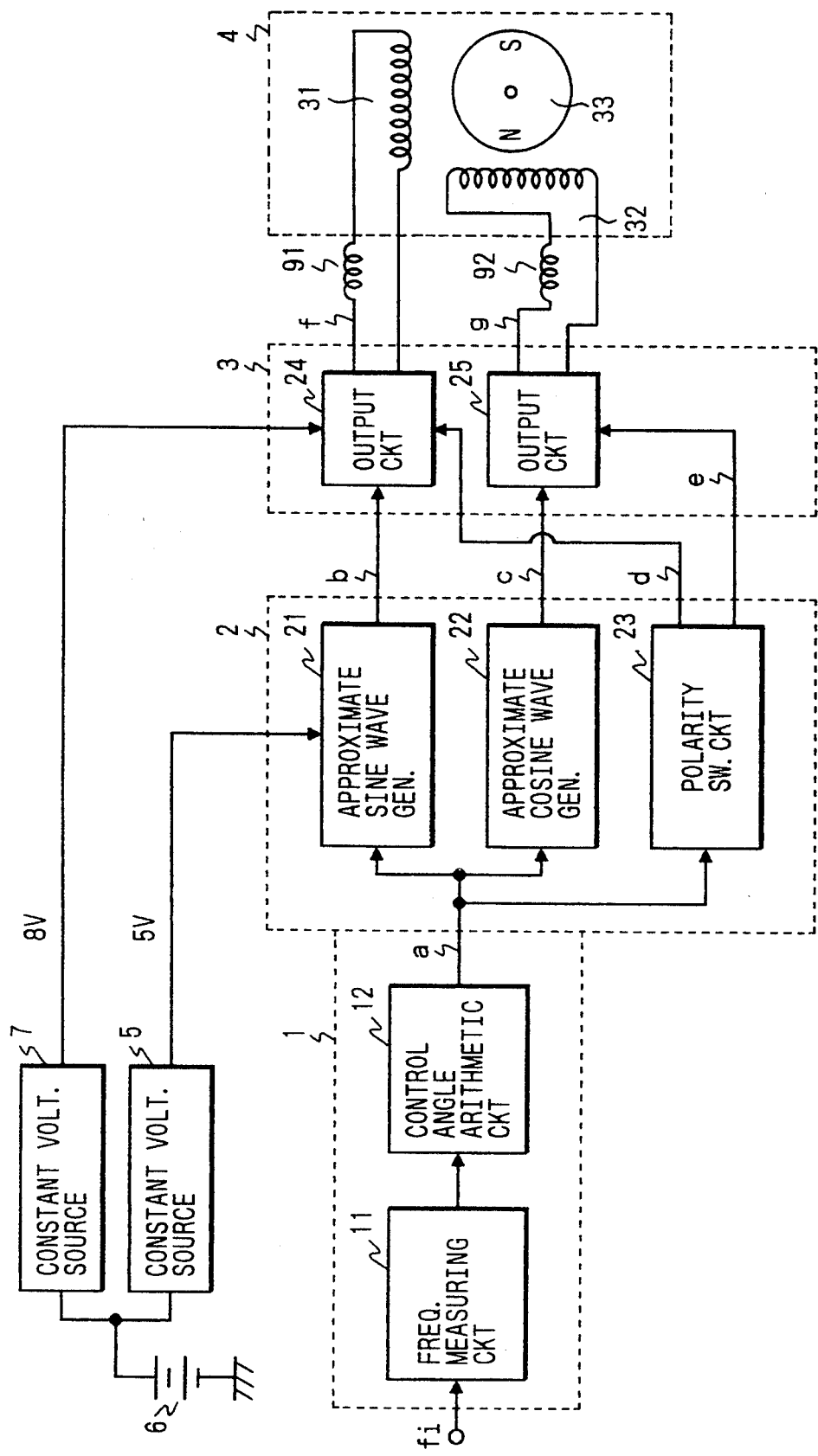
FIG. 8 is a circuit diagram, partly as a block diagram, showing the arrangement of an example of a cross-coil type measuring instrument, which constitutes a fourth embodiment of the invention.
Figure 9:
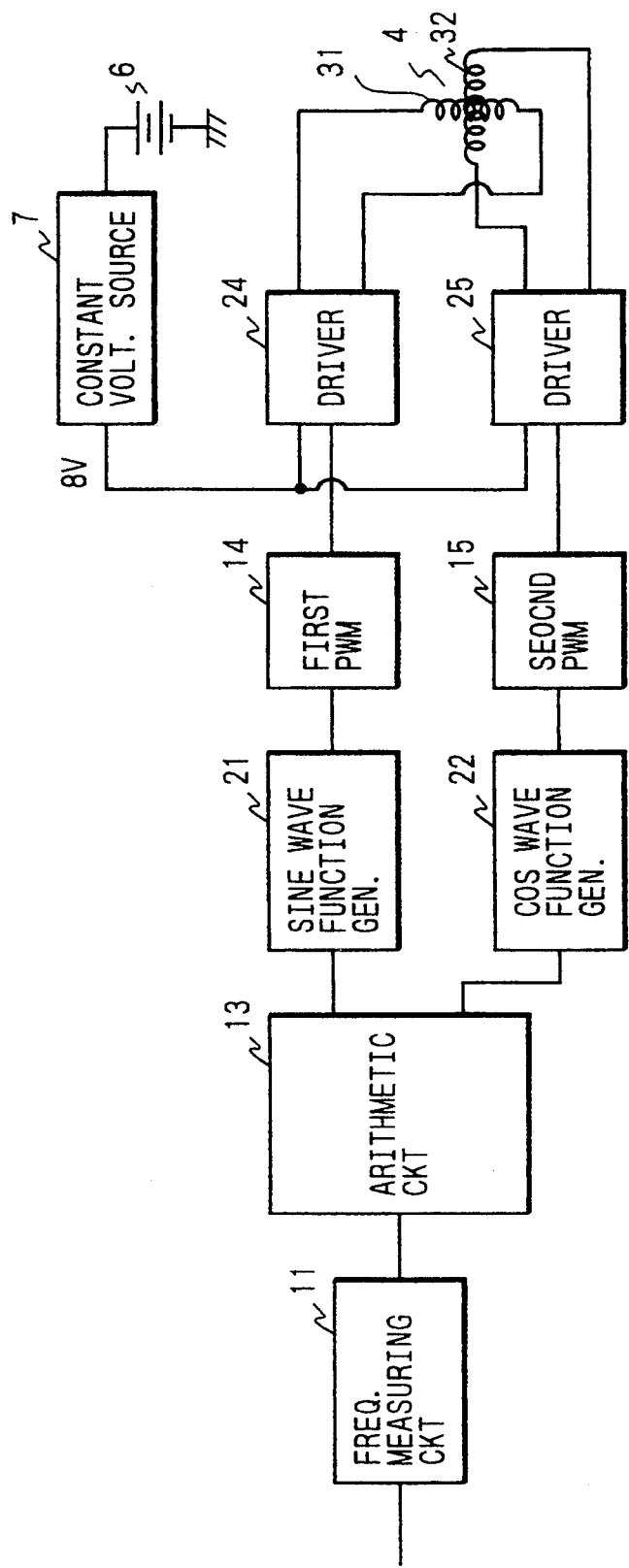
FIG. 9 is a circuit diagram, partly as a block diagram, showing the arrangement of an example of a conventional cross-coil type measuring instrument.

A fourth embodiment of the cross-coil type measuring instrument will be described with reference to FIG. 8. In FIG. 8, reference numerals 91 and 92 designate a pair of interference current blocking coils which are connected between the output circuit 24 and the drive coil 31 and between the output circuit 25 and the drive coil 32, respectively, to block an induction current such as a spike-shaped current and triangular-wave-shaped current, which is produced between the drive coils 31 and 32 by electromagnetic induction in the PWM driving operation. That is, those coils 8 and 9 act to decrease the interference current produced between the drive coils 31 and 32.

It is preferable to employ the interference current blocking coils having an inductance smaller than that of the cross-coil, so as to suppress cross-talk frequency component higher than several tens KHz. For example, in case of the inductance of the cross-coil being 20 mH, it is preferable to use the coil having the inductance of about 100 mH.

As was described above, in the fourth embodiment, the interference current blocking coils are interposed between the drive circuit and the drive coils, to block the interference current produced between the drive coils. Therefore, the currents flowing in the drive coils are scarcely affected by the interference current. That is, as is similar to the second embodiment, the cross-coil type measuring instrument is improved in the temperature characteristic concerning the interference current.

What is claimed is:

1. A cross-coil type measuring instrument comprising:
   a cross-coil type measuring means including a pair of coils arranged crossed forming a predetermined angle with each other, and a movable magnet magnetized bi-polar which is set rotatable by a magnetic action of said pair of coil;
   an arithmetic circuit means for receiving and converting values to be measured into control signals;
   a driving means for producing polarized drive signals which are different from each other in phase and change in response to variation in said values to be measured; and
   a constant voltage source for supplying a constant voltage to said driving means, the first constant voltage being switched to a second constant voltage periodically in response to a switching signal, said switching signal being controlled by said arithmetic circuit means.

2. The cross-coil type measuring instrument as defined in claim 1 wherein said constant voltage source comprises a series of first and second Zenor diodes, Zenor voltage of which are set to the first and second constant voltages, respectively, said first and second Zenor diodes being switched in response to the switching signal to supply either the first constant voltage or the second constant voltage to said driving means selectively.

3. The cross-coil type measuring instrument as defined in claim 2 wherein the first constant voltage is set to 8 V and the second constant voltage is set to 5 V.

4. The cross-coil type measuring instrument as defined in claim 1 wherein said driving means comprises means for reducing the first constant voltage to the second constant voltage in potential level.

5. A cross-coil type measuring instrument comprising:
   a cross-coil type measuring means including a pair of coils arranged crossed forming a predetermined angle with each other, and a movable magnet magnetized bi-polar which is set rotatable by a magnetic action of said pair of coil;
   an arithmetic circuit means for receiving and converting values to be measured into control signals;
   a driving means for producing polarized drive signals which are different from each other in phase and change in response to variation in said values to be measured;
   a constant voltage source for supplying a constant voltage to said driving means; and
   correction means, provided between said constant voltage source and said cross-coil type measuring means, for altering a voltage supplied to said cross-coil type measuring means, said correction means being controlled by said arithmetic circuit means.

6. The cross-coil type measuring instrument of claim 5, wherein said correction means switches said constant voltage supplied from said constant voltage source to said driving means from a first constant voltage to a second constant voltage in response to a switching signal.

7. The cross-coil type measuring instrument of claim 5, wherein said correction means comprises a positive characteristic heat-sensitive resistance element which is connected between said cross-coil type measuring means and said drive circuit to make the resistances of said paired coils equal to each other.

8. The cross-coil type measuring instrument of claim 5, wherein said correction means comprises a pair of interference current blocking coils which are connected between said driving means and said paired coils to block an induction current.

9. The cross-coil type measuring instrument of claim 5, wherein said correction means comprises current limiting resistors provided between said driving means and said pair of coils to reduce an amount of power supplied to said pair of coils.

10. The cross-coil type measuring instrument as defined in claim 1, wherein said control signals comprise pulse width modulation signals and polarity switching signals.

11. The cross-coil type measuring instrument as defined in claim 10, wherein said arithmetic circuit means converts said values to be measured into a movable magnet rotation control signal based on a frequency of said value to be measured, said pulse width modulation signals being produced as a function of said rotation control signal.

12. The cross-coil type measuring instrument as defined in claim 10, wherein said drive means polarizes said pulse width modulation signal according to said polarity switching signals to produce said polarized drive signals.

13. The cross-coil type measuring instrument as defined in claim 1, wherein said arithmetic circuit means controls the period and pause width of said switching signal.

14. The cross-coil type measuring instrument as defined in claim 2, wherein said arithmetic circuit means controls the period and pause width of said switching signal.

* * * * *